United States Patent
Liu et al.

(10) Patent No.: US 7,269,027 B2
(45) Date of Patent: *Sep. 11, 2007

(54) CERAMIC OPTICAL SUB-ASSEMBLY FOR OPTOELECTRONIC MODULES

(75) Inventors: Jia Liu, San Jose, CA (US); Luu Thanh Nguyen, Sunnyvale, CA (US); Ken Pham, San Jose, CA (US); William Paul Mazotti, San Martin, CA (US); Bruce Carlton Roberts, San Jose, CA (US); Stephen Andrew Gee, Danville, CA (US); John P. Briant, Cambridge (GB)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/344,721

(22) Filed: Jan. 31, 2006

(65) Prior Publication Data

US 2006/0140534 A1 Jun. 29, 2006

Related U.S. Application Data

(60) Division of application No. 10/165,711, filed on Jun. 6, 2002, now Pat. No. 7,023,705, which is a continuation-in-part of application No. 10/165,553, filed on Jun. 6, 2002, now Pat. No. 6,916,121.

(60) Provisional application No. 60/331,339, filed on Aug. 3, 2001.

(51) Int. Cl.
*H05K 7/02* (2006.01)

(52) U.S. Cl. .......................................... 361/760; 385/92

(58) Field of Classification Search ................ 361/760; 385/92

See application file for complete search history.

(56) References Cited

U.S. PATENT DOCUMENTS 3,749,882 A * 7/1973 Pilkington et al. .......... 219/390

(Continued)

FOREIGN PATENT DOCUMENTS

JP 60-202956 10/1985
JP 08125066 5/1996

OTHER PUBLICATIONS

S. Savastiouk, PH.D., et al. "3-D stacked wafer-level packaging", Mar. 2000, *Advanced Packaging*, pp. 28-34.

(Continued)

*Primary Examiner*—Jack I. Berman
*Assistant Examiner*—Phillip A. Johnston
(74) *Attorney, Agent, or Firm*—Beter Weaver LLP

(57) ABSTRACT

Optoelectronic components, specifically, ceramic optical sub-assemblies are described. In one aspect, the optoelectronic component includes a ceramic base substrate having a pair of angled (or substantially perpendicular) faces. The electrical traces are formed directly on the ceramic surfaces and extend between the pair of faces. A semiconductor chip assembly is mounted on the first face of the ceramic base substrate and a photonic device is mounted on the second face. Both the semiconductor chip assembly and the photonic device are electrically connected to traces on the ceramic base substrate. The semiconductor chip assembly is generally arranged to be electrically connected to external devices. The photonic devices are generally arranged to optically communicate with one or more optical fibers. The described structure may be used with a wide variety of photonic devices. It is particularly well adapted for use with vertical cavity surface emitting lasers (or laser arrays) and detectors (or detector arrays). In some embodiments, at least the cathode of the photonic device is soldered directly to a cathode pad on the base substrate. Similarly, in some embodiments, the semiconductor chip assembly is electrically connected to the base substrate by direct soldering. Specific base substrate structures are disclosed as well.

20 Claims, 6 Drawing Sheets

U.S. PATENT DOCUMENTS

| | | | |
|---|---|---|---|
| 4,152,711 A | 5/1979 | Nakata | |
| 5,011,246 A | 4/1991 | Corradetti et al. | |
| 5,019,673 A | 5/1991 | Juskey et al. | |
| 5,054,870 A | 10/1991 | Losch et al. | |
| 5,076,688 A | 12/1991 | Bowen et al. | |
| 5,139,969 A | 8/1992 | Mori | |
| 5,208,879 A | 5/1993 | Gallo et al. | |
| 5,325,455 A | 6/1994 | Henson et al. | |
| 5,349,317 A | 9/1994 | Notani et al. | |
| 5,352,926 A | 10/1994 | Andrews | |
| 5,487,124 A | 1/1996 | Bowen et al. | |
| 5,515,467 A | 5/1996 | Webb | |
| 5,519,205 A * | 5/1996 | Rostoker | 250/208.1 |
| 5,521,992 A | 5/1996 | Chun et al. | |
| 5,535,296 A * | 7/1996 | Uchida | 385/89 |
| 5,579,208 A | 11/1996 | Honda et al. | |
| 5,590,232 A | 12/1996 | Wentworth et al. | |
| 5,608,262 A | 3/1997 | Degani et al. | |
| 5,621,837 A | 4/1997 | Yamada et al. | |
| 5,625,734 A | 4/1997 | Thomas et al. | |
| 5,723,369 A | 3/1998 | Barber | |
| 5,726,079 A | 3/1998 | Johnson | |
| 5,744,827 A | 4/1998 | Jeong et al. | |
| 5,768,456 A | 6/1998 | Knapp et al. | |
| 5,774,616 A | 6/1998 | Matsuda | |
| 5,780,875 A | 7/1998 | Tsuji et al. | |
| 5,790,384 A | 8/1998 | Ahmad et al. | |
| 5,798,567 A | 8/1998 | Kelly et al. | |
| 5,821,615 A | 10/1998 | Lee | |
| 5,864,642 A | 1/1999 | Chun et al. | |
| 5,896,479 A | 4/1999 | Vladic | |
| 5,933,558 A | 8/1999 | Sauvageau et al. | |
| 5,949,135 A | 9/1999 | Washida et al. | |
| 6,027,254 A | 2/2000 | Yamada et al. | |
| 6,030,246 A | 2/2000 | Kunishi | |
| 6,043,430 A | 3/2000 | Chun | |
| 6,054,759 A | 4/2000 | Nakamura | |
| 6,075,284 A | 6/2000 | Choi et al. | |
| 6,086,263 A | 7/2000 | Selli et al. | |
| 6,201,704 B1 | 3/2001 | Poplawski et al. | |
| 6,236,109 B1 | 5/2001 | Hsuan et al. | |
| 6,239,427 B1 | 5/2001 | Mizue | |
| 6,258,630 B1 | 7/2001 | Kawahara | |
| 6,281,568 B1 | 8/2001 | Glenn et al. | |
| 6,305,848 B1 | 10/2001 | Gregory | |
| 6,316,837 B1 | 11/2001 | Song | |
| 6,316,838 B1 | 11/2001 | Ozawa et al. | |
| 6,318,902 B1 | 11/2001 | Igl et al. | |
| 6,318,909 B1 | 11/2001 | Giboney et al. | |
| 6,356,686 B1 | 3/2002 | Kuczynski | |
| 6,364,542 B1 | 4/2002 | Deane et al. | |
| 6,450,704 B1 * | 9/2002 | O'Connor et al. | 385/92 |
| 6,497,518 B1 | 12/2002 | Deane | |
| 6,583,902 B1 | 6/2003 | Yuen | |
| 6,595,699 B1 | 7/2003 | Nguyen et al. | |
| 6,599,033 B1 | 7/2003 | Pohnke | |
| 6,619,858 B1 | 9/2003 | Lytel et al. | |
| 6,624,507 B1 | 9/2003 | Nguyen et al. | |
| 6,635,866 B2 | 10/2003 | Chan et al. | |
| 6,655,854 B1 | 12/2003 | Nguyen et al. | |
| 6,702,480 B1 | 3/2004 | Sparacino | |
| 6,703,561 B1 | 3/2004 | Rosenberg et al. | |
| 6,707,140 B1 | 3/2004 | Nguyen et al. | |
| 6,737,931 B2 * | 5/2004 | Amparan et al. | 333/34 |
| 6,792,171 B2 | 9/2004 | Hargis et al. | |
| 6,821,027 B2 | 11/2004 | Lee et al. | |
| 6,916,121 B2 | 7/2005 | Mazotti et al. | |
| 2001/0013645 A1 | 8/2001 | King et al. | |
| 2001/0048151 A1 | 12/2001 | Chun | |
| 2002/0136502 A1 | 9/2002 | Bachl et al. | |
| 2003/0026081 A1 | 2/2003 | Liu et al. | |
| 2003/0026556 A1 | 2/2003 | Mazotti et al. | |
| 2003/0169980 A1 | 9/2003 | Yang | |
| 2003/0201462 A1 | 10/2003 | Pommer et al. | |
| 2004/0091208 A1 | 5/2004 | Doi | |

OTHER PUBLICATIONS

National Semiconductor, "Packaging Databook", *1993 National Semiconductor*, pp. v-xi to 1-3 to 1-4, 3-1 to 3-20, 3-30 to 3-31, 3-62 to 3-69. *Please note: The year of publication is sufficiently earlier than the effective U.S. filing date so that the particular month of publication is not in issue.*

* cited by examiner

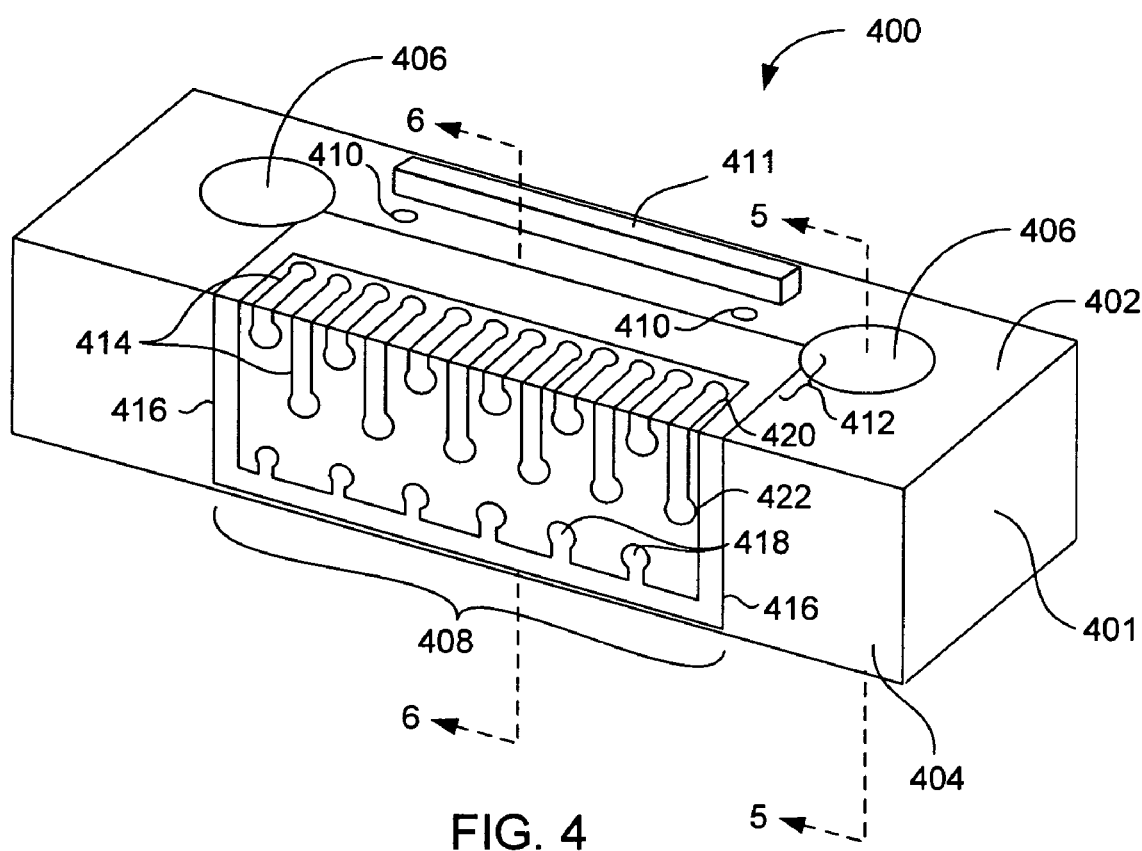
FIG. 4
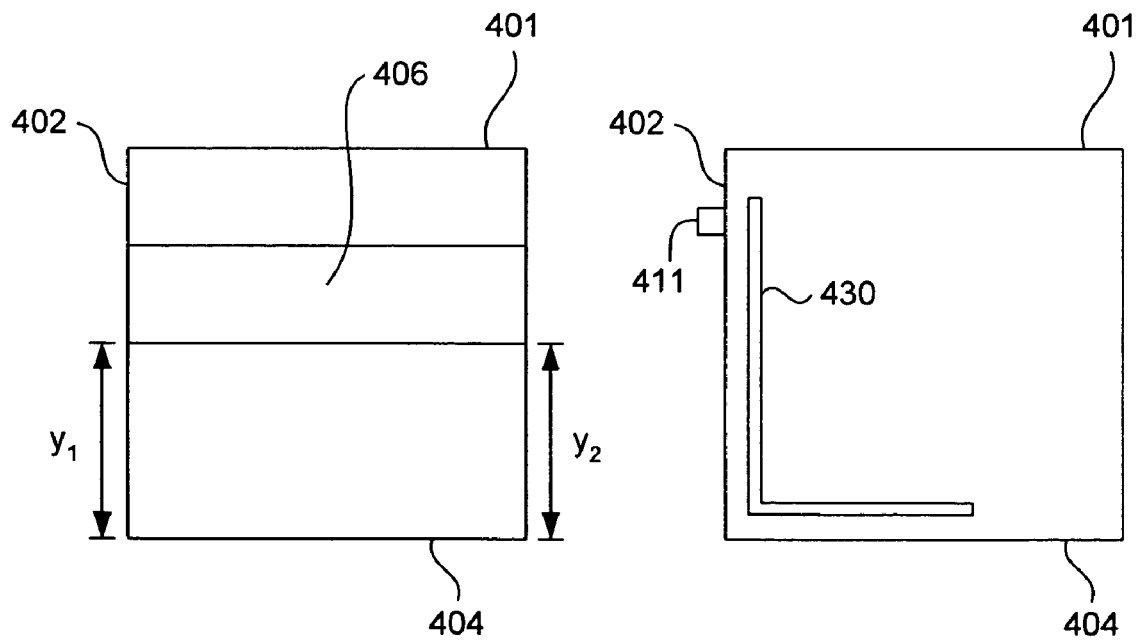
FIG. 5
FIG. 6

CERAMIC OPTICAL SUB-ASSEMBLY FOR OPTOELECTRONIC MODULES

CROSS-REFERENCE TO RELATED APPLICATIONS

This application is a divisional application of U.S. patent application Ser. No. 10/165,711, filed on Jun. 6, 2002, now U.S. Pat No. 7,023,705, entitled "CERAMIC OPTICAL SUB-ASSEMBLY FOR OPTOELECTRONIC MODULES", which is a continuation-in-part application of U.S. patent application Ser. No. 10/165,553, filed on Jun. 6, 2002, now U.S. Pat. No. 6,916,121, entitled "OPTICAL SUB-ASSEMBLY FOR OPTOELECTRONIC MODULES," which claims priority of U.S. provisional patent application No. 60/331,339, filed Aug. 3, 2001, entitled "OPTICAL SUB-ASSEMBLY FOR OPTOELECTRONIC MODULES," all of which are hereby incorporated by reference.

This application claims priority of U.S. provisional patent application No. 60/331,338, filed Nov. 20, 2001, entitled "CERAMIC OPTICAL SUB-ASSEMBLY FOR OPTOELECTRONIC MODULES," which is hereby incorporated by reference.

This application is related to U.S. patent application Ser. No. 09/568,094, entitled "DEVICE AND METHOD FOR PROVIDING A TRUE SEMICONDUCTOR DIE TO EXTERNAL FIBER OPTIC CABLE CONNECTION," filed on May 9, 2000, to U.S. patent application Ser. No. 09/568,558, entitled "ARRAYABLE, SCALABLE AND STACKABLE MOLDED PACKAGE CONFIGURATION," filed on May 9, 2000, to U.S. patent application Ser. No. 09/713,367, entitled "MINIATURE OPTO-ELECTRIC TRANSCEIVER," filed on Nov. 14, 2000, to U.S. patent application Ser. No. 09/922,358, entitled "MINIATURE SEMICONDUCTOR PACKAGE FOR OPTO-ELECTRONIC DEVICES," filed on Aug. 3, 2001, to U.S. patent application Ser. No. 09/922,598, entitled "TECHNIQUES FOR JOINING AN OPTO-ELECTRONIC MODULE TO A SEMICONDUCTOR PACKAGE," filed on Aug. 3, 2001, and to U.S. patent application Ser. No. 10/165,548, entitled "TECHNIQUES FOR ATTACHING ROTATED PHOTONIC DEVICES TO AN OPTICAL SUB-ASSEMBLY IN AN OPTOELECTRONIC PACKAGE," filed concurrently herewith, the content of each of which are hereby incorporated by reference.

FIELD OF THE INVENTION

The present invention relates generally to transduction modules, and more specifically, to ceramic optical sub-assemblies for use with opto-electronic modules.

BACKGROUND OF THE INVENTION

Most computer and communication networks today rely on copper wiring to transmit data between nodes in the network. Since the data transmitted over the copper wire and the data processed within the nodes are both represented in the form of electrical signals, the transfer of data at the node-copper wire interface is straight forward. Other than perhaps a level shift and signal amplification, no other signal processing is required for data transmitted over the copper wire to be decoded by the node. The drawback with using copper wire is its relatively low bandwidth. Copper's ability to transmit data is significantly limited compared to other media, such as fiber optics. Accordingly much of the computer and communication networks being built today, including the Internet, are using fiber optic cabling instead of copper wire.

With fiber optic cabling, data is transmitted using light signals, not electrical signals. For example, a logical one may be represented by a light pulse of a specific duration and a logical zero may be represented by the absence of a light pulse for the same duration. In addition, it is also possible to transmit at the same time multiple colors of light over a single strand of optic fiber, with each color of light representing a distinct data stream. Since light is attenuated less in fiber than electrons traveling through copper, and multiple data streams can be transmitted at one time, the bandwidth of optic fiber is significantly greater than copper.

While fiber optic cabling is very efficient for transferring data, the use of light signals to process data is still very difficult. Data is typically transferred and stored in various locations before, during and after it is operated on in a computer. There still is no efficient way to "store" light signals representative of data. Networks will therefore likely continue using fiber optics for transmitting data between nodes and silicon chips to process the data within the nodes for the foreseeable future. The interface between the fiber optic cable and the nodes that process the data is therefore problematic because signals need to be converted between the electrical and the light domains.

Fiber optic transceivers, which convert light signals from a fiber optic cable into electrical signals, and vice versa, are used as the interface between a fiber optic line and a computer node. A typical transceiver includes a substrate, grooves etched in the substrate to receive the individual fiber optic strands, one or more semiconductor devices mounted on the substrate, one or more discrete optical detectors for converting light signals received over the fiber optic cables into electrical signals, one or more discrete optical emitters for converting electrical signals from the semiconductor devices into light signals. A number of fiber optic transceivers are commercially available from Hewlett Packard, AMP, Sumitomo, Nortel, and Siemens. The problem with all of these fiber optic transceivers is that they are expensive and difficult to fabricate. With each transceiver, the semiconductor devices, emitters, and optical detectors have to be individually mounted onto the substrate, which is a costly and time-consuming process. This limits the applications in which optical interconnects could be substituted for traditional copper usage. Furthermore, the use of discrete emitters and optical detectors adversely affects the performance of the transceiver because electrical parasitics between discrete components are sources of electrical attenuation of inter-chip signals at Gigabit per second speeds that are generally used with such transceivers. To compensate for the electrical parasitics, more power is required to drive these traces than would be needed for an integrated device. The form factor of the on-board optical transceiver is relatively large and therefore does not facilitate inter-board and chip-to-chip optical interconnectability. Also, current opto-electronic packages have relatively large form factors. For instance, some opto-electronic packages and their attachment configurations require optical fibers to bend in order to be connected to the active facets of the optical device. Unfortunately, optical fibers can only bend with relatively large radii, thereby causing the opto-electronic packages to occupy large amounts of space.

A low cost semiconductor device that has a small form factor and that provides a true die to external fiber optic connection is therefore needed.

BRIEF SUMMARY OF THE INVENTION

The present invention pertains to an optical sub-assembly (OSA), which is an interface device for translating high-speed electrical data signals into optical data signals (and vice versa). The optical sub-assembly has a supporting wall with photonic devices that are mounted in a normal orientation with respect to the supporting wall. The optical sub-assembly is designed to couple tightly to the semiconductor chip sub-assembly (CSA) so that the electrical path lengths between the photonic devices and the semiconductor chip are minimized. Specifically, the OSA is formed of ceramic. A ceramic OSA provides for various advantages such as easier and more efficient manufacturing techniques, tighter metalization line densities, tighter dimensional tolerances and better thermal behavior. The optical sub-assembly can be used to form optical-electrical modules for transceiver, transmitter and receiver applications. Such applications include, but are not limited to, chip-to-chip, board-to-board, chassis-to-chassis, and system-to-system inter-networking.

One aspect of the invention pertains to an optoelectronic package that includes a backing block, an electrical circuitry set, a semiconductor chip assembly and a photonic device. The backing block has a front face and a bottom face that are each angled relative to one another, wherein the front face and bottom face interface along a 90-degree corner. The electrical circuitry set is formed on the front and bottom face, the circuitry set including a metal pad formed on the front face and traces that extend from the front face to the bottom face. The semiconductor chip assembly is mounted to the bottom face of the backing block. The semiconductor chip assembly has a first surface having a plurality of first contacts that are electrically coupled to associated traces on the bottom face of the backing block by direct soldering and a second surface opposite the first surface, the second surface of the semiconductor chip assembly having plurality of second contacts that are suitable for electrical connection to external devices. The photonic device has at least one active facet thereon and a cathode and at least one anode, the photonic device being mounted to the metal pad on the front face of the backing block such that the cathode is in contact with the metal pad.

Another aspect of the invention pertains to a ceramic support structure for use in an optoelectronic package. The ceramic support structure includes a front and bottom face, an electrical circuitry set formed on both the front and bottom faces, a pair of alignment holes, and an alignment slot. The front face is suitable for supporting a photonic device and the bottom face is suitable for attachment to a semiconductor device, wherein the bottom face is angled relative to the front face. The pair of alignment holes are located in the front face and are suitable for receiving associated alignment pins for engaging an optical fiber termination device. The alignment slot is positioned in the front face.

BRIEF DESCRIPTION OF THE DRAWINGS

The invention, together with further advantages thereof, may best be understood by reference to the following description taken in conjunction with the accompanying drawings in which:

FIG. 4 illustrates a perspective view of an OSA according to one embodiment of the present invention.

FIG. 5 illustrates "parallelism" through a side plan, cross-sectional view of backing block along line 5-5 of FIG. 4.

FIG. 6 illustrates a side-plan, cross-sectional view of OSA along line 6-6 of FIG. 4 to show the ground plane.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to an optical sub-assembly (OSA), which is an interface device for translating high-speed electrical data signals into optical data signals (and vice versa). The optical sub-assembly has a supporting wall with photonic devices that are mounted in an orientation that is rotated with respect to the top surface of the chip sub-assembly. The optical sub-assembly is designed to couple tightly to the semiconductor chip sub-assembly (CSA) so that the electrical path lengths between the photonic devices and the semiconductor chip are minimized. In this manner, electrical interference from parasitic inductance and capacitance is minimized, signal integrity is maximized, and power requirements are reduced. The optical sub-assembly can be used to form transudction modules such as optical-electrical modules for transceiver, transmitter and receiver applications. Such applications include, but are not limited to, chip-to-chip, board-to-board, chassis-to-chassis, and system-to-system inter-networking. More generally stated, the concepts of the present invention can be used to conveniently arrange devices for the transduction of signals to and from voltage and current domains to infrared radiation domains.

The OSA of the present invention is specifically formed of ceramic. A ceramic OSA provides for various advantages such as simple and efficient manufacturing techniques, tighter metalization line densities, tighter dimensional tolerances, better thermal behavior, and short interconnect distances between the photonic devices and the chip sub-assembly. These advantages will be further discussed below.

Figure 1:
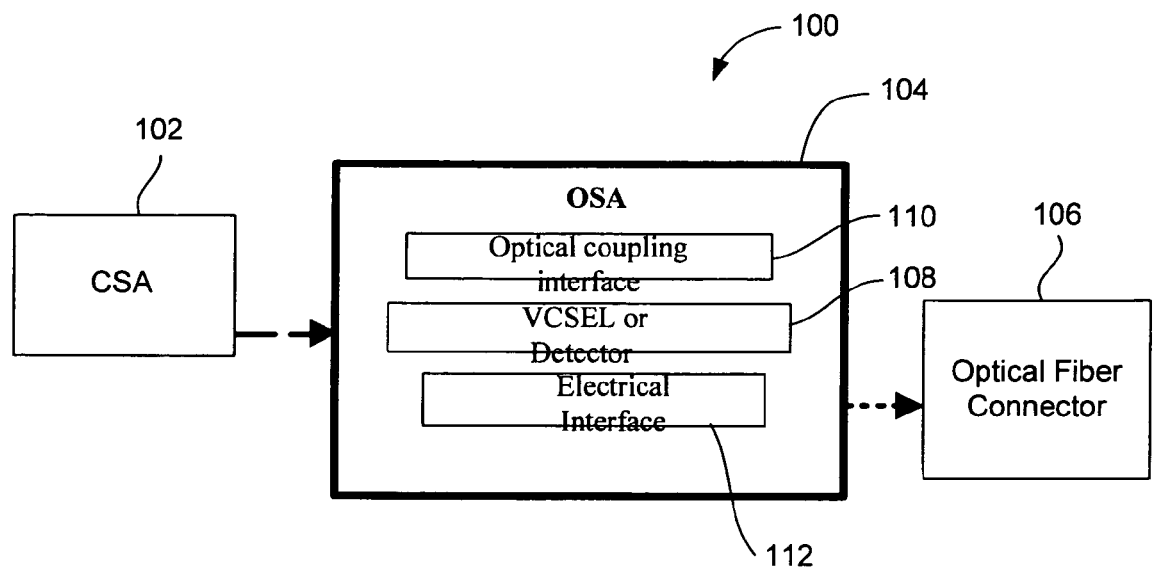
FIG. 1 is a block diagram describing the structural overview of the opto-electronic module of the present invention.

FIG. 1 is a block diagram describing the structural overview of the optoelectronic module 100 of the present invention. The opto-electronic module 100 is composed of a semiconductor chip sub-assembly (CSA) 102 that is attached to an optical sub-assembly (OSA) 104. The CSA 102 and the OSA 104 operate together to translate optical signals to electrical signals and vice-versa. The OSA 104 receives and transmits optical signals from and to optical fibers that are connected to the OSA 104. Optical fiber connector 106 represents a connector that attaches a ribbon of multiple optical fibers to the OSA 104. For example, see the ferrule 106 of FIG. 3. CSA 102 can be formed of a variety of semiconductor chip packages that have electrical connection pathways for connection to optical sub-assemblies. For instance, the CSA 102 can be a leadless leadframe package (LLP) that has up-linking contact surfaces that are exposed through the top surface of the LLP. CSA 102 can also be any type of driver device, such as multi-chip assemblies, as well as conventional driver boards. The OSA 104 is essentially made up of photonic devices 108, an optical coupling interface 110, and an electrical interface 112. The photonic devices 108 are either optical emitters (e.g., lasers) or detectors. The photonic devices 108 can include a single laser or detector or the devices can include a multiple array of either emitters or detectors. In a preferred embodiment of the present invention, the photonic devices 108 are vertical cavity surface emitting lasers (VCSELs). VCSELs are a type of emitter that requires lower amounts of power and has a high degree of operational reliability. Various transduction devices can be used in place of the photonic devices. For instance, other types of suitable transduction devices can contain components such as, but not limited to, windows, lenses, prisms, and gratings. For more details regarding CSA's that are formed from LLP's, refer to U.S. patent application Ser. No. 09/922,358, entitled "MINIATURE SEMICONDUCTOR PACKAGE FOR OPTO-ELECTRONIC DEVICES".

The optical coupling interface 110 is the structural interface where the photonic devices 108 connect to the optical fiber connector 106. The electrical interface 112 is the structural interface that allows the photonic devices 108 to be electrically connected to the CSA 102.

Figure 2:
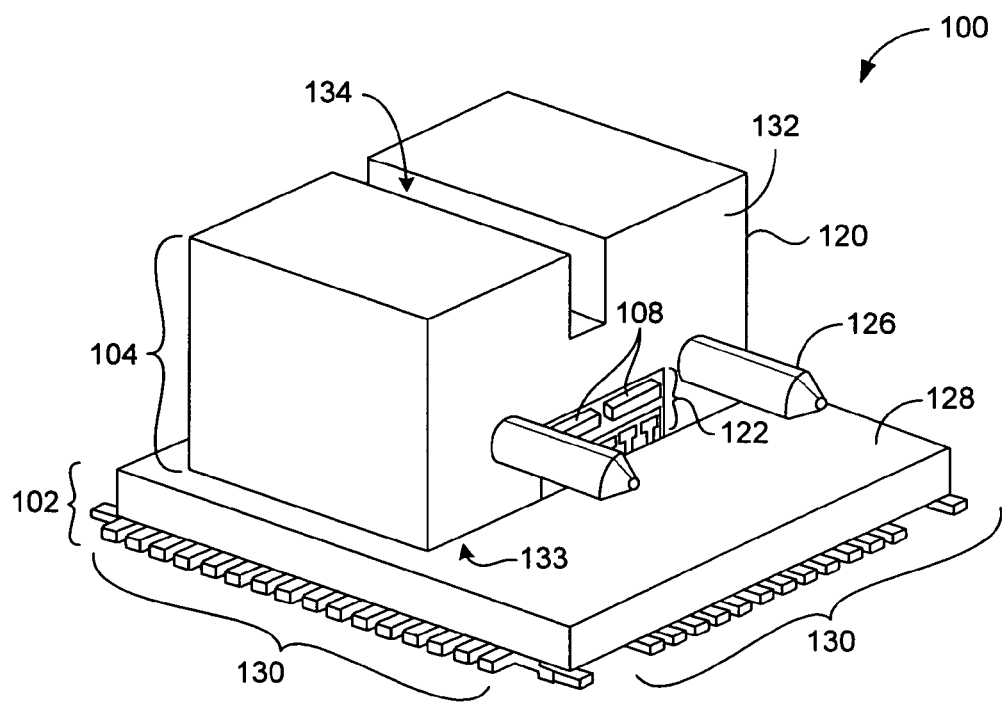
FIG. 2 illustrates a perspective view of optoelectronic module that is made up of a CSA and an OSA according to one embodiment of the present invention.

FIG. 2 illustrates a perspective view of optoelectronic module 100 that is made up of a CSA 102 and an OSA 104 according to one embodiment of the present invention. FIG. 2 is a physical embodiment of optoelectronic module block representation of FIG. 1. OSA 104 is formed of a ceramic backing block 120, a set of conductive circuitry 122 that includes a pad and individual traces, photonic devices 108, and alignment pins 126. CSA 102 is shown to be an LLP that has a molded plastic package 128 with contact leads 130 that protrude from the bottom surface. Protruding contact leads 130 are suitable for hot bar reflow, which is where a heated bar is used to melt the contact leads such that they bond with an external surface. In alternative embodiments of CSA 102, contact leads 130 can be flush with the side surfaces of CSA 102. When the contact leads are flush with the body of CSA 102, CSA 102 can be attached through conventional techniques, such as those that use solder. OSA 104 is attached to the top surface of CSA 102 through techniques that use materials such as solder balls or anisotropic conductive films.

The ceramic backing block 120 is the main structural component that forms OSA 104. Backing block 120 is a substantially rectangular block with a front surface 132 for supporting photonic devices 108 that are attached to circuitry set 122, and alignment pins 126. In FIG. 2, backing block 120 has a front surface 132 that is perpendicular to the bottom surface. The relative angles of these two surfaces will determine the angle at which optical fibers must be attached to backing block 120 in order to have a functional optoelectronic module. The upright orientation of the front surface 132 is advantageous for attaching VCSELs to the backing block since optical fibers can then be attached to the front surface 132 in approximately a perpendicular orientation with the front surface of the backing block. In this way, optical fibers need not be bent in order to make a connection with the optoelectronic device made with backing block 120. As is commonly known, bending of optical fibers creates inefficiencies in the transmission of light through the fibers. In alternative embodiments, the orientation of the front surface 132 to the bottom surface of the backing block may be offset from perpendicular. This may be advantageous depending upon the physical constraints into which the optoelectronic module will be used.

Figure 8A:
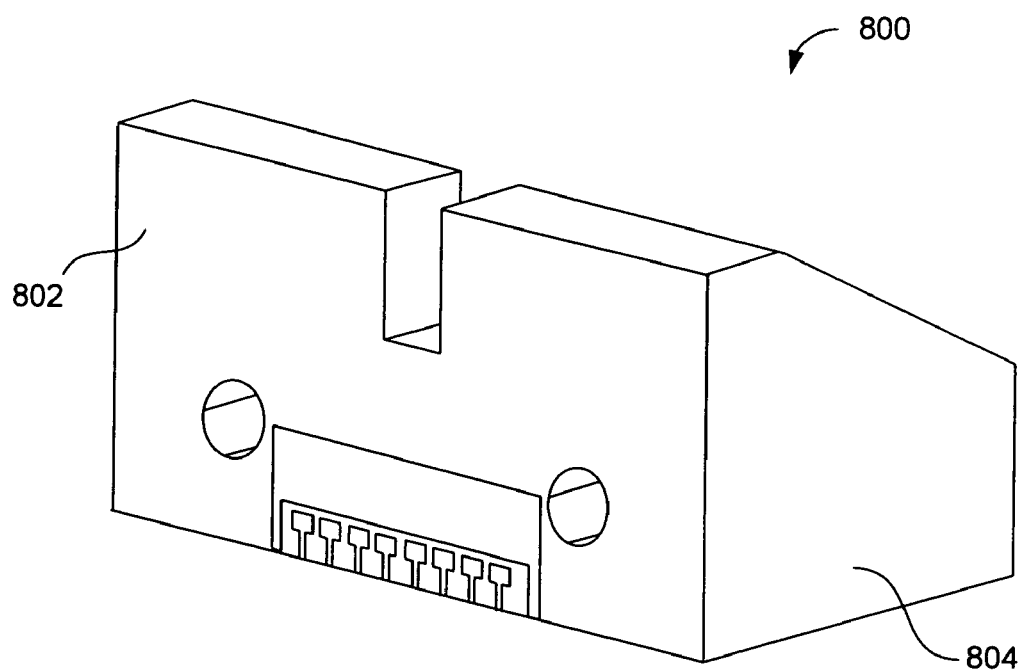
FIGS. 8A and 8B illustrate an alternative embodiment of the OSA of the present invention.
Figure 8B:
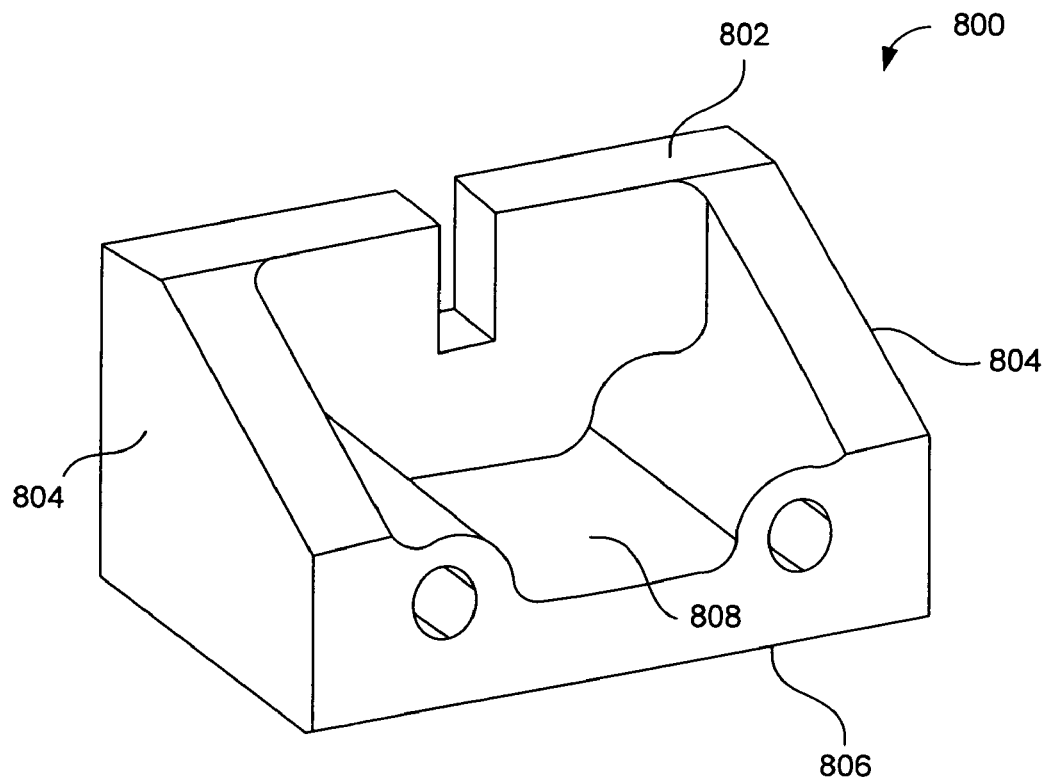

Backing block 120 need not have a strictly block shape as shown in FIG. 2. In some embodiments, it is preferable to have a somewhat triangular shape as is shown in FIGS. 8A and 8B, for manufacturing reasons that will be explained later.

Slot 134 is formed in the top surface of the backing block 120 for the purpose of attaching a protective case or sleeve over the opto-electronic module 100. Slot 134 also provides general alignment between the case and the OSA. The case or sleeve protects optoelectronic module 100 during handling and operation. For more detail regarding the case or sleeve, refer to U.S. patent application Ser. No. 09/713,367, entitled "MINIATURE OPTO-ELECTRIC TRANSCEIVER".

Circuitry set 122 forms the electrical interface, which connects the photonic devices 108 to CSA 102. Circuitry set 122 covers a portion of the front surface 132 of backing block 120, wraps around the bottom-front corner 133 of the backing block 120, and covers a portion of the bottom surface of backing block 120. The traces within circuitry set 122 run from the photonic devices 108 on the front surface to the bottom surface of the backing block 120 where they make contact with up-linking, electrical contacts on the CSA 102. Circuitry set 122 can be either embedded within or formed on the surface backing block 120. Traces within 122 are formed of conductive materials that can be metal or non-metal. Circuitry set can be formed through various methods including metal deposition processes and pre-forming the traces and pads.

Alignment pins 126 are inserted into the front face 132 of backing block 120. Pins 126 serve to align the connection between photonic devices 108 of OSA 104 and optical fibers to be connected to OSA 104. Tolerances for the alignment between OSA 104 and an optical fiber connector are very high, therefore, the positioning of the holes into which the alignment pins are inserted and the alignment pins themselves must be manufactured with precision. Preferably, pins 126 are formed of ceramic such that their coefficient of thermal expansion substantially matches that of backing block 120. Otherwise, non-matching coefficients of thermal expansion can allow pins 126 to cause cracking within backing block 120. Pins 126 can take on various shapes and forms in alternative embodiments. For instance, pins 126 can be integrally formed from the ceramic material of backing block 120. Alignment pins 126 can extend from backing block 120 at a variety of predetermined angles, not necessarily perpendicular to the front surface of backing block 120, to serve the alignment function.

Two photonic devices 108 are connected to circuitry set 122. Photonic devices 108 are blocks of semiconductor material having optical circuitry formed within it. Commonly, the semiconductor material is Gallium-Arsenide. The bottom surface of photonic devices 108 form respective cathodes, which are bonded to circuitry set 122. The backside or cathode of devices 108 are attached by one of several adhesives such as Epoxy (e.g., Epotek H20E, E3001, EG11-3, EMI Emcast 501, 550) or eutectic solder.

In this embodiment, photonic devices 108 contain an array of VCSELs and the other contains an array of optical detectors. The combination of laser emitters and detectors on OSA 104 makes the optoelectronic module 100 a transceiver. For instance a 4-channel transceiver may be formed of one 1×4 laser emitter array and one 1×4 detector array. However, in alternative embodiments, only one array of laser emitters may be connected to the OSA 104, thereby making the module 100 a transmitter. For instance, a twelve-channel transmitter can have a single 1×12 VCSEL array module with 12 fiber connections. Likewise, in another alternative embodiment, only one array of detectors is connected to the OSA 104, thereby making the module 100 a receiver. For instance, a twelve-channel detector can have a single 1×12 detector array module with 12 fiber connections.

Figure 3:
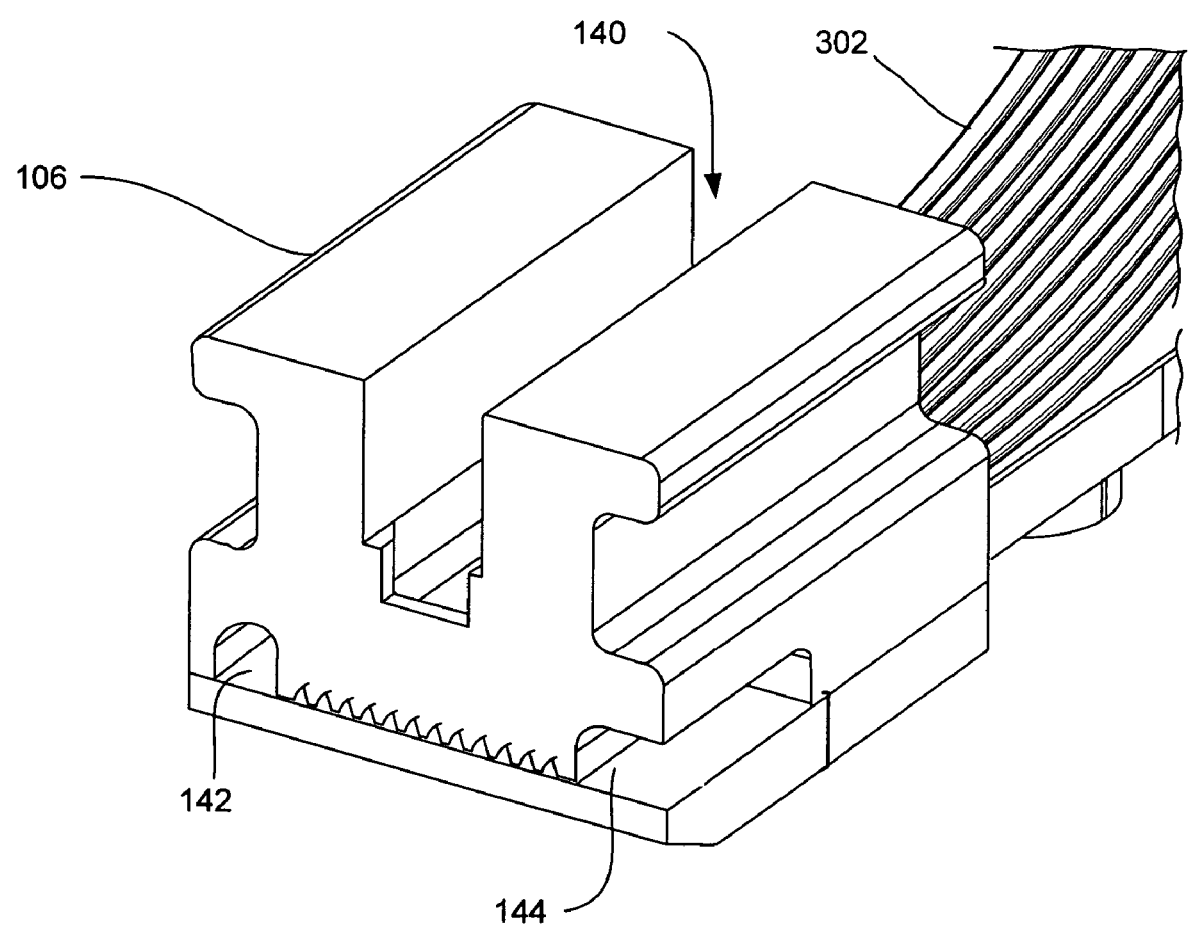
FIG. 3 illustrates a perspective view of optical fiber connector ferrule, which clamps onto a ribbon of optical fibers.

FIG. 3 illustrates a perspective view of optical fiber connector ferrule 106, which clamps onto a ribbon of optical fibers 302. Optical fiber connector ferrule can also be referred to as a fiber termination device. Optical fiber connector ferrule 106 has formed within it, a slot 140 that receives a protruding portion of a sleeve device and two alignment holes 142 and 144. Alignment holes 142 and 144 receive the alignment pins 126. Slot 140 becomes aligned with slot 134 of backing block 120 after ferrule 106 is attached to backing block 120. To maintain the high tolerances required for the connection between each of the optical fibers and photonic devices 108, ferrule 106 must be manufactured with precision. Specifically, the size and location of the alignment holes 142 and 144 must be carefully formed. In some embodiments, ferrule 106 is formed of material having the same coefficient of thermal expansion as that of OSA 104 so that disparate rates of expansion and contraction do not cause damage to the optoelectronic system during operation. Alignment hole 142 is an enclosed hole within which an alignment pin 126 is secured. Alignment hole 144, however, has an open side in order to facilitate the insertion of the two pins. Dynamic constraint is established with such a design since the open side allows for minor misalignment due to thermal mismatch or manufacturing tolerances of the various components. A design that calls for pin insertion into two circular holes requires much tighter tolerances than can be achieved in a cost-effective manner with the current materials selected.

FIG. 4 illustrates a perspective view of OSA 400 according to one embodiment of the present invention. The front surface 402 and the bottom surface 404 of OSA 400 face upwards and out of the page, respectively. Two alignment holes 406 extend from front surface 402 to the opposite (back) surface of backing block 400. Conductive circuitry set 408 covers a portion of front surface 402 and extends onto bottom surface 404. Fiducials 410 formed on the front surface 402 of OSA 400 can be used to assist in the alignment process of attaching photonic devices to the OSA 400. Fiducials 410 can be dimples that are either set into or protrude out of the surface of OSA 400.

A shim 411 is attached to front surface 402 of OSA 400 alignment holes 406. Shim 411 acts as a spacer to prevent a ferrule, such as ferrule 106 in FIG. 3, from making contact with photonic device(s) that will be attached to pad 412. Shim 411 also maintains a fixed separation distance between the photonic device(s) and the optical fibers that are to be attached to OSA 400. Shim 411 operates by acting as a barrier against which the ferrule comes into contact with when attached to OSA 400. To be effective, shim 411, is formed to have a height that extends past the height of attached photonic devices. Shim 411 can be formed out of a variety of materials that can be manufactured with a high degree of precision. For example, shim 411 can be formed of stainless steel. Shim 411 can be attached to OSA 400 using various types of adhesives. Shim 411 is shown to be a long block of material, however, it can also be replaced with multiple shims that are smaller in size. Shim 411 can also be integrally formed with the ceramic material of block OSA 400.

A method of forming backing block 401 of OSA 400 is by injection molding of ceramic material into a molding chamber. After injection molding, metalization techniques are used to create circuitry set 408 on backing block 401. High purity alumina is preferably used to form backing block 401 in order to obtain smooth surfaces that are required for subsequent metalization processes. Specifically, high purity alumina reduces surface porosity. High purity alumina is considered to be approximately in the range of being greater than 95% pure. Preferably, alumina of 99.6-99.98% purity can be used. With ceramic thin film processing, typically a thin adhesion layer (e.g., chrome, titanium, or tungsten) is sputtered before the metalization process to ensure that the metal bonds well to the ceramic surface. On the other hand, with ceramic thick film processing, an acid etch is typically used to clean the ceramic surface prior to the printing of the metalization paste for firing.

A molding chamber for injection molding can be configured to create various features in backing block 401. The molding tool can be designed to hold multiple cavities so to yield multiple units with repeatable tolerances. Ceramic molding processes allow for repeatability to be achieved within +/−4 microns.

Formation of alignment holes 406 must be performed with precision so that optical fibers can be properly aligned with the photonic devices to be attached to OSA 400. Proper formation of the alignment holes allows the alignment pins to extend from the OSA 400 in the correct orientation such that a ferrule can be secured to OSA 400 in the correct position. A ceramic injection molding process can be performed to comply with very high tolerances such that alignment holes 406 can be formed with a high degree of precision. One of the various requirements of manufacturing precision is that of alignment hole "parallelism." One requirement of parallelism is that the entire length of alignment holes 406 should maintain a uniform distance from the bottom surface 404 of backing block 401. A measure of this aspect of parallelism is the difference between the distance between each of the alignment hole 406 openings on the front 402 and back surfaces of backing block 401 to the bottom surface 404. Preferably, the difference between the distances should be approximately less than or equal to 10 um. FIG. 5 illustrates "parallelism" through a side plan, cross-sectional view of backing block 401 along line 5-5 of FIG. 4. In FIG. 5, $y_1$ and $y_2$ represent the distances between the front and back openings of alignment hole 406 to the bottom surface 404, respectively. Using the reference symbols of FIG. 5, the difference between $y_1$ and $y_2$ should be preferably and approximately less than or equal to 10 um. Of course, another aspect of parallelism is that the alignment holes should be parallel to each other.

In some manufacturing processes, the alignment holes 406 are used as reference points by the cameras of alignment systems in order to properly position, for example, the circuitry set 408 and the photonic devices onto the backing block. However, OSA 400 contains fiducials 410, which can also be used by alignment systems during manufacturing processes. Alignment systems can more easily utilize fiducials 410, rather than alignment holes 406, because fiducials 410 are sized more closely to the features of other reference points (e.g., the anode pad of a photonic device). Alignment processes using fiducials 410 are easier to utilize because the cameras of alignment systems can focus on similarly sized objects. In comparison, it is more difficult to adjust a camera of an alignment system to sequentially focus on objects having very different sizes. For example, an alignment hole and an anode pad of a photonic device can have very different respective diameters of 700 and 70 um. Fiducials 410 can be easily formed on a surface of OSA 400 during the injection molding manufacturing process of backing block.

Circuitry set 408 includes a metal pad 412 that serves as a cathode and individual traces 414. Photonic devices are attached to metal pad 412 such that their cathode contact surfaces make contact with metal pad 412. Cathode traces 416 connect metal pad 412 to cathode contact pads 418 on the bottom surface 404 of backing block 401. Cathode contact pads 418 provide the contact surfaces that will be connected to the contact surfaces on the chip sub-assembly. Traces 414 provide the electrical connection between the anodes of the photonic devices and the contact surfaces on the chip sub-assembly. Each of the traces 414 have a contact pad 420 on the end of the traces on the front surface 402 and a contact pad 422 on the bottom surface 404 to facilitate electrical connections.

Circuitry set 408 needs to be compatible with wirebonding on the front surface 402 and solder connections on the bottom surface 404. On the front surface 402, the anode pads of the photonic devices will be wirebonded to contact pads 420 of traces 414. While, on the bottom surface 404, cathode contact pads 418 and contact pads 422 will be connected to the contact surface of a chip sub-assembly through solder balls, wirebond studs and/or anisotropic conductive film. The contact pads 420 preferably have a nickel/gold plating. The thin nickel layer acts as a barrier metal underneath the thicker gold layer required so that pads 420 can withstand the forces experienced during wirebonding processes. A layer of gold can also be formed over the cathode contact pads 418 and contact pads 422 on the bottom surface 404. The layer of gold on the bottom surface 404 can be thinner than the layer on contact pads 420 on the front surface since wirebonding is not involved. Actually, the gold layer on the bottom surface should not be overly thick as excessive gold can cause solder material to become brittle.

Standard metalization of the contact areas 418, 420 and 422 can be titanium tungsten and gold (TiW/Au) with a barrier layer of either nickel (Ni) or palladium (Pd). The resulting TiW/Ni/Au or TiW/Pd/Au can have the following representative thicknesses: TiW approximately 600 Angstroms; Ni or Pd approximately 2000 Angstroms; Au approximately 100 micro-inch or 2.54 um. In particular implementations, solder masks can be applied at selected locations over circuitry set 408 to facilitate the soldering process. For example, solder masks having holes that expose only the contact surfaces such as 418 and 422 can prevent short circuits for forming. Also, solder masks can prevent the copper metal of the circuitry sets from oxidizing.

Thin film application techniques can be used to form circuitry set 408 on backing block 401. Such techniques include sputtering, electro and electroless plating, the use photoresist techniques, among others. The metalization techniques can produce line pitches between the pad and individual traces of approximately 20 microns (line width) on 10 microns if the gold thickness is approximately 4 microns or less. Since the metalization techniques can form circuitry set 408 around sharp corners, it is preferable that the corner of the front 402 and bottom 404 surfaces of backing block 401 have a right-angled corner. In this manner, the interconnection distance between the photonic devices and the chip sub-assembly is minimized. This, in turn, beneficially improves the electrical performance of the entire opto-electronic module because electrical interference due to inductance and capacitance is reduced.

FIG. 6 illustrates a side-plan, cross-sectional view of OSA 401 along line 6-6 of FIG. 4 to show ground plane 430. Ground plane 430 is embedded within backing block 401 such that ground plane 430 lies beneath the front 420 and bottom 404 surfaces. Ground plane 430 is connected to metal pad 412 (the cathode) to facilitate operation of the photonic devices and minimize parasitics. It should be noted that this process can be extended to include a number of ground planes, if required. When a ground plane is required, the injection molding process mentioned previously can no longer be used. Rather, the ceramic OSA will need to be processed using conventional multi-layer ceramic processing. In this case, a stack of ceramic "green sheets" with patterned metal can be fired together so to fuse the layers into a coherent structure with embedded ground planes and signal traces. It is noted that ground plane 430 need not be formed within backing block 401 for OSA 400 to function.

Figure 7A:
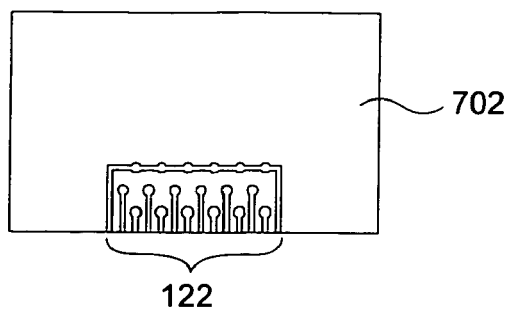
FIGS. 7A-7D present additional plan views of OSA of FIG. 2.
Figure 7B:
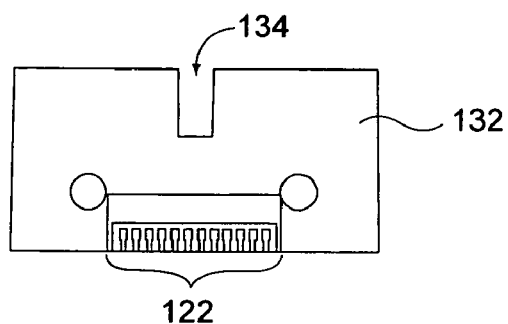
Figure 7C:
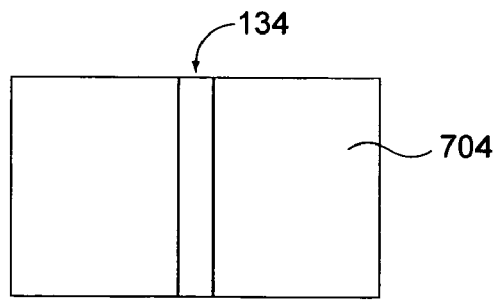
Figure 7D:
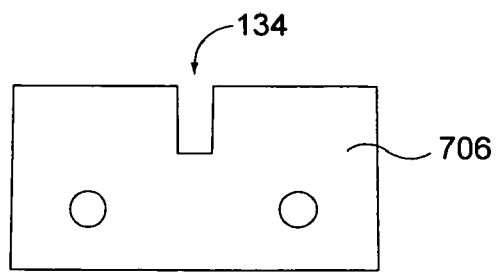

FIGS. 7A-7D present additional plan views of OSA 104 of FIG. 2. FIG. 7A illustrates a plan view of the bottom surface 702 of OSA 104. The bottom surface 702 is the surface in contact with CSA 102 in FIG. 2. FIG. 7B illustrates a plan view of the front surface 132 of OSA 104. FIG. 7C illustrates a plan view of the top surface 704 of OSA 104. FIG. 7D illustrates a plan view of the back surface 706 of OSA 104.

FIGS. 8A and 8B illustrate an alternative embodiment of the OSA of the present invention. OSA 800 in FIGS. 8A and 8B has a hollow configuration that is formed of four panels—a front panel 802, two side panels 804, and a bottom panel 806. For manufacturing purposes, the four panels have approximately the same thickness. This is advantageous when OSA 800 is formed by an injection molding process at high temperatures because the various regions of OSA 800 can cool at the same rate during the cooling stages of the manufacturing process. By cooling at the same rate, it is more likely to obtain an OSA manufactured with the required dimensional tolerances. An OSA being formed of panels is also advantageous, in comparison to a solid block OSA, during the operation of the optoelectronic module in heat transfer respects. For example, a backing block having panels allows heat to transfer more quickly away from the optoelectronic module and into a sleeve device, which is more capable of dissipating heat. In an alternative embodiment, the backing block can have an additional panel that is positioned in between and parallel to the side panels. Such an additional panel can provide extra support to the front and bottom panels.

For manufacturing purposes, it is preferable to leave a flat area 808 on the top surface of the bottom panel 806 so that vacuum-based pick-and-place machines can pick up OSA 800. Preferably, OSA 800 has a flat area having a minimum 250 um diameter to ensure pick and place compatibility. Of course, OSA 800 can be handled by alternative pick-and-place machines that do not require flat surfaces to be effective.

In alternative embodiments, the bottom surface of the backing block can have a structure that creates a reproducible standoff height between the OSA and a CSA. This can be achieved for example by forming legs or pedestals of a known height on the bottom panel 806, or by precisely controlling the positioning of the OSA on the CSA during the solder reflow attach process.

Figure 9A:
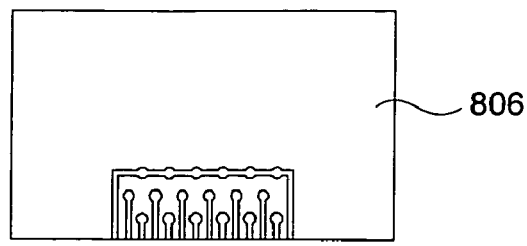
FIGS. 9A-9D present additional plan views of OSA of FIGS. 8A and 8B.
Figure 9B:
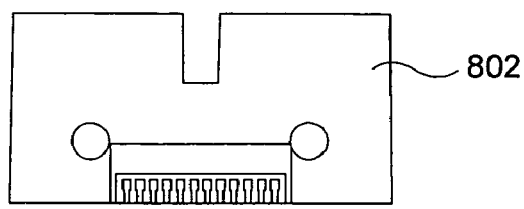
Figure 9C:
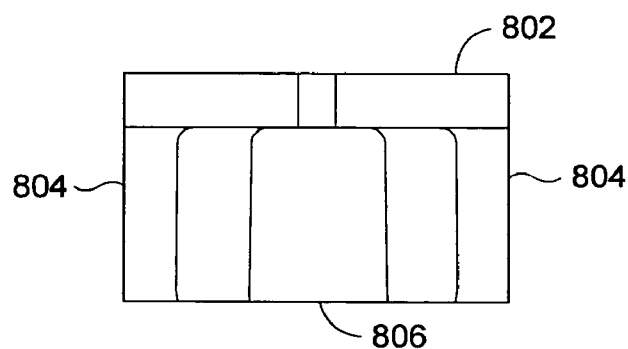
Figure 9:
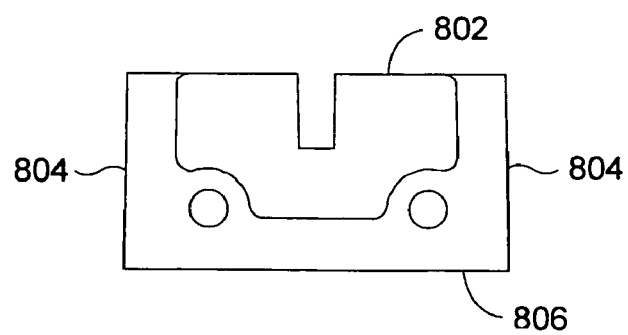

FIGS. 9A-9D present additional plan views of OSA 800 of FIGS. 8A and 8B. FIG. 9A illustrates a plan view of the bottom panel 806 of OSA 800. FIG. 9B illustrates a plan view of the front panel 802 of OSA 800. FIG. 9C illustrates a top plan view of OSA 800. FIG. 9D illustrates a back plan view of OSA 800.

In an alternative embodiment of the present invention, a hinge can be formed on the backing block into which a pin on the ferrule can be inserted. This hinge configuration allows for the ferrule to swing about the backing block in a similar manner to a door in a doorframe. The purpose of this configuration is to allow the optical fiber(s) to be brought into and out of optical communication with the photonic device through this swinging action. Location of the hinge, which determines the axis about which the ferrule rotates, should be offset from the photonic device. For example, the hinge can be formed at a side or above the photonic device. The hinge can be formed so that the swinging ferrule can be removed when desired, or the swinging ferrule can be permanently attached to the hinge of the backing block.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

The invention claimed is:

1. A ceramic backing block for use in an optoelectronic package, the backing block comprising:
   a rigid backing block body formed from a single piece ceramic or fused layer having a front face and a bottom face;
   the front face suitable for supporting a photonic device and including a shim that is attached to the front face and positioned between a pair of alignment holes in the front face;
   the bottom face suitable for attachment to a driver module, the bottom face being angled relative to the front face;
   an electrical circuitry set formed on both the front and bottom faces of the rigid backing block body, the electrical circuitry set including a cathode pad suitable for supporting a photonic device and a plurality of anode pads;
   the pair of alignment holes in the front face being suitable for receiving associated alignment pins suitable for engaging an optical fiber termination device;
   an alignment slot positioned in the front face;
   at least one ground plane is formed inside the rigid backing block body under the electrical circuitry set.

2. A ceramic backing block as recited in claim 1 wherein the alignment slot is arranged to align the backing block relative to a sleeve, which holds the packaged optoelectronic component.

3. A ceramic backing block as recited in claim 1 wherein the front face and the bottom face are angled at 90 degrees with respect to each other and the front face and the bottom face interface along a 90-degree corner.

4. A ceramic backing block as recited in claim 1 wherein the ceramic backing block is formed of alumina having purity of at least 95%.

5. A ceramic backing block as recited in claim 1 for use in an optoelectronic package, the backing block further comprising
   a pair of side walls that extend between the front and bottom faces defining an empty space between the sidewalls and behind the front wall.

6. A ceramic backing block as recited in claim 5 wherein the driver module is a semiconductor device.

7. An optoelectronic package as recited in claim 5 wherein the electrical circuitry includes a metal pad having a surface area that is approximately the same or larger than the first surface of the photonic device.

8. A ceramic backing block as recited in claim 1 wherein the cathode pad has a larger surface area than a surface area of each of the anode pads.

9. A ceramic backing block as recited in claim 1 wherein the cathode pad is suitable for supporting a photonic device having multiple active facets.

10. A ceramic backing block as recited in claim 1 further comprising:
    a photonic device having at least a first surface and a second surface wherein the first surface and the second surface are on opposing sides of the photonic device, a cathode being formed on the first surface and an active facet and at least one anode being formed on the second surface, the first surface of the photonic device being directly mounted onto the cathode pad of the backing block, wherein the active facet faces away from the backing block.

11. A ceramic backing block as recited in claim 10 wherein the cathode pad has a surface area that is approximately the same or larger than the first surface of the photonic device.

12. A ceramic backing block as recited in claim 5 wherein the cathode pad has a larger surface area than a surface area of each of the anode pads.

13. An optoelectronic package as recited in claim 1 wherein the photonic device comprises a VCSEL laser.

14. An opto electronic package as recited in claim 1 wherein the photonic device comprises an optical receiver.

15. An optoelectronic package as recited in claim 5 wherein the photonic device comprises a VCSEL laser.

16. An optoelectronic package as recited in claim 5 wherein the photonic device comprises an optical receiver.

17. The ceramic backing block of claim 5 wherein the electrical circuitry set formed is formed on the front and bottom faces using a metal deposition process.

18. The ceramic backing block of claim 5 wherein the electrical circuitry set is affixed to the front and bottom faces using a flexible tape having metal electrical circuitry formed thereon.

19. The ceramic backing block of claim 3 wherein the angled front face and bottom face are angled at 90 degrees with respect to each other and the front face and the bottom face interface along a 90-degree corner.

20. A ceramic backing block as recited in claim 1 wherein a pair of alignment pins are mounted in the pair of alignment holes and wherein the pins are formed of the same material as the ceramic backing block.

* * * * *